United States Patent
Tracy et al.

[11] Patent Number: 5,902,690
[45] Date of Patent: May 11, 1999

[54] STRAY MAGNETIC SHIELDING FOR A NON-VOLATILE MRAM

[75] Inventors: Clarence J. Tracy, Tempe; Eugene Chen, Gilbert; Mark Durlam; Theodore Zhu, both of Chandler; Saied N. Tehrani, Tempe, all of Ariz.

[73] Assignee: Motorola, Inc., Schaumburg, Ill.

[21] Appl. No.: 08/806,275

[22] Filed: Feb. 25, 1997

[51] Int. Cl.$^6$ ....................................................... B32B 9/00
[52] U.S. Cl. ........................ 428/693; 427/131; 427/132; 428/694 TM; 428/694 TP
[58] Field of Search ................................. 427/131, 132, 427/129, 130; 428/694 MM, 694 TP, 694 TM, 693

*Primary Examiner*—Bernard Pianalto
*Attorney, Agent, or Firm*—Eugene A. Parsons; William A. Koch

[57] ABSTRACT

A non-volatile magneto-resistive memory positioned on a semiconductor substrate is shielded from stray magnetic fields by a passivation layer partially or completely surrounding the non-volatile magneto-resistive memory. The passivation layer includes non-conductive ferrite materials, such as Mn—Zn-Ferrite, Ni—Zn-Ferrite, MnFeO, CuFeO, FeO, or NiFeO, for shielding the non-volatile magneto-resistive memory from stray magnetic fields. The non-conductive ferrite materials may also be in the form of a layer which focuses internally generated magnetic fields on the non-volatile magneto-resistive memory to reduce power requirements.

15 Claims, 2 Drawing Sheets

STRAY MAGNETIC SHIELDING FOR A NON-VOLATILE MRAM

FIELD OF THE INVENTION

The present invention pertains to non-volatile magneto-resistive memories and more specifically to passivation of non-volatile magneto-resistive memories.

BACKGROUND OF THE INVENTION

Very high density non-volatile memories utilizing Giant Magneto-Resistive (GMR) materials as the memory element integrated with CMOS devices or circuits have been proposed. These memories operate by storing information as the orientation of the magnetization vectors in the GMR memory elements. The magnetization vectors are oriented by means of applied magnetic (H) fields. The magnetic fields used to read and write the orientation of the magnetization vectors are generated by the integrated CMOS circuitry. Stray magnetic fields, generated external to the memory, having sufficient magnitude could cause errors in memory retention.

Stray or externally generated magnetic fields can come from an almost infinite number of sources. Stray magnetic fields having sufficient magnitude may cause the magnetization vectors stored in a magnetic memory to change uncontrollably. High density non-volatile magneto-resistive memories are especially sensitive to stray fields because the cells are becoming very small and, hence, require relatively low fields for reading and writing (switching or sensing the magnetic vectors). Also, stray fields from neighboring cells become larger as the distance between neighboring cells decreases at high densities.

One method of avoiding sensitivity to stray magnetic fields is to design the memory elements or cells such that they require higher switching fields than the stray fields they would encounter in commercial or military use. This method requires an exhaustive characterization of the stray fields encountered in these applications. This method also sets higher limits of internal power requirements to operate the memory, since higher internal fields requires more power to generate the higher internal fields, making them high power devices and, therefore, less desirable. The market for high density memories is extremely competitive. Cost differentials between suppliers of milli-cents per bit can mean success or failure in the market place. The addition of manufacturing steps or increased packaging complexity adds cost to the product which could determine the competitiveness of the product in the market place.

Accordingly it is highly desirable to provide a non-volatile magneto-resistive memory which is shielded from stray magnetic fields without adding substantial cost to the memory.

It is a purpose of the present invention to provide a new and improved non-volatile magneto-resistive memory with stray magnetic shielding.

It is another purpose of the present invention to provide a new and improved non-volatile magneto-resistive memory with stray magnetic shielding which does not add substantially to the cost of the memory.

It is still another purpose of the present invention to provide a new and improved non-volatile magneto-resistive memory with stray magnetic shielding which is incorporated into the standard passivation technique.

It is a further purpose of the present invention to provide a new and improved non-volatile magneto-resistive memory with stray magnetic shielding which also focuses the internally generated magnetic fields.

It is a still further purpose of the present invention to provide a new and improved non-volatile magneto-resistive memory with stray magnetic shielding which also focuses the internally generated magnetic fields so as to reduce the amount of power required to operate the memory.

It is a still further purpose of the present invention to provide a new and improved non-volatile magneto-resistive memory with focusing of the internally generated magnetic field.

SUMMARY OF THE INVENTION

The above problems and others are at least partially solved and the above purposes and others are realized in a non-volatile magneto-resistive memory with stray magnetic shielding including a non-volatile magneto-resistive memory positioned on a substrate and a passivation layer at least partially surrounding the non-volatile magneto-resistive memory. The passivation layer includes ferrite materials for shielding the non-volatile magneto-resistive memory from stray magnetic fields, examples of the ferrite material including: Mn—Zn-Ferrite, Ni—Zn-Ferrite, MnFeO, CuFeO, FeO, and NiFeO.

Various specific applications of the ferrite shielding include intermixing powdered ferrite in a layer of passivation material to provide shielding against stray magnetic fields and forming a layer of ferrite material over the non-volatile magneto-resistive memory to focus internally generated magnetic fields as well as shielding the non-volatile magneto-resistive memory against stray magnetic fields. Focusing the internally generated magnetic fields reduces the amount of internally generated magnetic field required for switching and sensing, which in turn reduces the amount of operating power used by the non-volatile magneto-resistive memory.

BRIEF DESCRIPTION OF THE DRAWINGS

Referring to the drawings.

DESCRIPTION OF THE PREFERRED EMBODIMENTS

Figure 1:
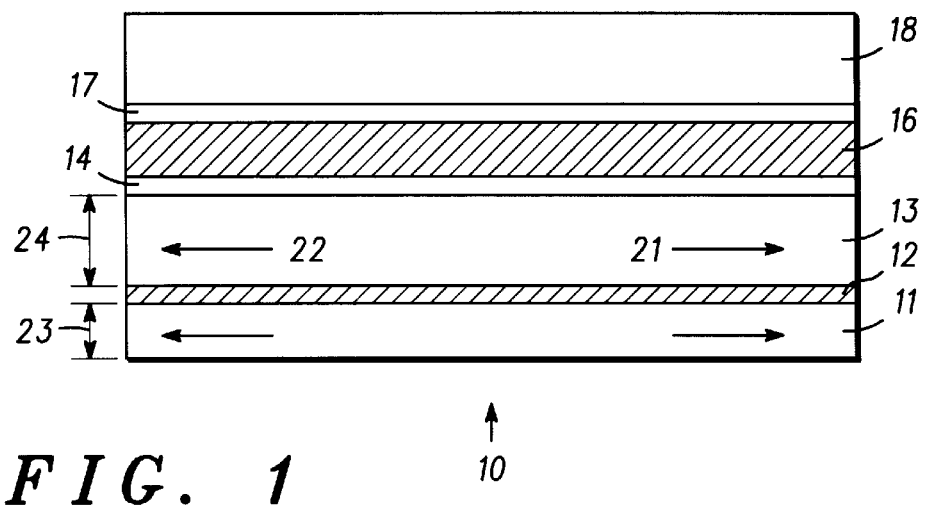
FIG. 1 is a simplified and enlarged cross-sectional view of a portion of a non-volatile magneto-resistive memory in accordance with the present invention.

Turning now to the drawings, FIG. 1 is an enlarged cross-sectional view of an example of a giant magnetoresistive GMR cell 10 having multiple layers that are ferromagnetically coupled. Non-volatile magneto-resistive memory cell 10 is used in this explanation only for example and it will be understood by those skilled in the art that any of a variety of non-volatile magneto-resistive memory cells can be used in conjunction with the present structure. Cell 10 has a plurality of magnetic layers including a first magnetic layer 11 and a second magnetic layer 13. Layers 11 and 13 are separated by a first conductive spacer layer 12. Magnetic layers 11 and 13 each can be single layers of magnetic materials or, alternately, can be a composite magnetic layer. Additionally, layer 11 has a first thickness or thickness 23 and layer 13 has a second thickness or thickness 24 that is greater than thickness 23.

In this example, layers 11 and 13 are rectangular and are formed with the easy axis of magnetization along a length 27 and not along a width 26. In other types of devices, the easy axis can be along width 26. Layers 11 and 13 each have magnetization vectors 21 and 22 that are substantially along length 27, that is, substantially parallel to length 27. Here it should be understood that only one set of vectors, 21 or 22, will be present in cell 10 but the two different states are illustrated simultaneously in FIG. 1 for convenience. Layers 11 and 13 are coupled by a ferromagnetic coupling which allows vectors 21 and 22 to align in the same direction in the absence of an external magnetic field. This coupling is a function of the material and the thickness of layer 12.

Additionally width 26 is formed to be smaller than the width of the magnetic domain walls or transition width within layers 11 and 13. Consequently, vectors 21 and 22 cannot be parallel to width 26. Typically, widths of less than 1.0 to 1.2 microns result in such a constraint. In this example, width 26 is less than one micron and is as small as can be made by manufacturing technology, and length 27 is approximately five times width 26. Also in this example, thickness 23 is approximately three to six nanometers and thickness 24 is approximately four to ten nanometers. As will be seen hereinafter, the difference in thickness 23 and 24 affects the switching points of layers 11 and 13. Vectors 21 and 22 illustrate two different states of magnetization vectors within cell 10. One state is referred to as a logic "0" and the other state is a logic "1". For each state vectors in both layers 11 and 13 point in a first direction, and for the other state vectors in both layers 11 and 13 point in the opposite or second direction.

To write or change the state of cell 10, a total magnetic field is applied that is sufficient to completely switch the direction of the magnetic vectors of both layers 11 and 13 from along one direction of length 27 to along the opposite direction of length 27, that is, to switch from the state represented by vectors 21 to the state represented by vectors 22 or vice versa. To provide the total magnetic field, a transverse conductor or word line 16 is formed on the surface of a dielectric 14 overlying memory cell 10 and a second conductor (not shown) is connected to opposite ends of cell 10 in individual rows to form a sense line. A combination of the sense line and word line 16 are also used to read, or sense, the state stored in cell 10. It should be noted that in some cases, an additional digit line (not shown) which is perpendicular to word line 16 is required to ensure that the value of the total magnetic field is sufficient to cause the magnetic vectors to either rotate or to switch. The value of the total magnetic field is a summation of the magnetic fields resulting from the sense, word, and digit line currents.

Figure 2:
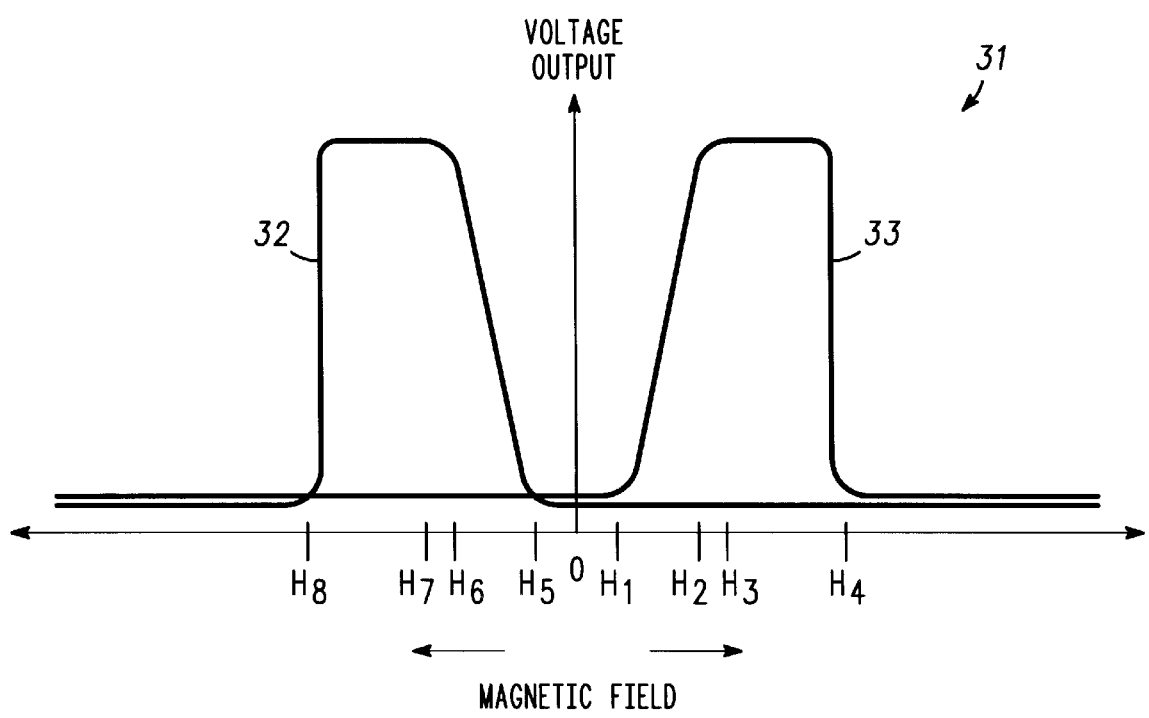
FIG. 2 is a graphical representation of magnetic fields required for switching states in the non-volatile magneto-resistive memory of FIG. 1.

FIG. 2 is a graph 31 illustrating the resistance or voltage output of cell 10 (FIG. 1) verses the applied magnetic field or total magnetic field. The abscissa indicates magnetic field direction and strength, that is, the strength either supports or opposes the magnetic vectors of cell 10. The ordinate represents the voltage output of cell 10. A curve 32 indicates the magnetoresistance characteristic, via the output voltage, for various magnetic field intensities for one direction of magnetization vectors (for example vectors 21). A curve 33 indicates the magnetoresistance characteristic, via the output voltage, for the same magnetic field intensities for the opposite direction of magnetization vectors (for example vectors 22). To the right of zero, curves 32 and 33 indicate the output voltage for magnetic fields that support the vectors of curve 32 and oppose the vectors of curve 33, and magnetic fields to the left of zero support the vectors of curve 33 and oppose the vectors of curve 32. Typically, curves 32 and 33 cross the voltage axis at the same point and have the same minimum values. For the sake of explanation, curve 33 is shifted vertically a slight amount to show the differences between the curves.

At zero applied field, the voltage output of cell 10 is approximately the same regardless of the magnetization vector direction. As the field increases from zero to $H_1$, curve 33 shows the voltage output of cell 10 having vectors that are opposed by the total magnetic field, and curve 32 shows the voltage of cell 10 having vectors that are supported by the magnetic field. At magnetic field intensity of $H_1$, the vectors of the layer 11 begin to rotate and increase the output voltage. As the total magnetic field intensity increases between $H_1$ and $H_3$, the magnetic vectors of layer 11 continue to rotate and snap to the other direction near a field intensity of $H_3$. Near $H_4$, the vectors of thicker layer 13 snap to the opposite direction and the resistance decreases for values of $H_4$ and above. Similarly, the output voltage for an opposite direction total magnetic field is shown between zero and $H_5$ to $H_8$.

The resistance is normally determined by sensing a voltage output of cell 10. The voltage output is the voltage drop across the length of cell 10 with a constant current applied along the length of cell 10 and while a magnetic field is applied. One method of determining the state of cell 10 is to apply a total magnetic field that is higher than the switching threshold for layer 11 (i.e. $H_3$) but not as high as the switching threshold for layer 13 (i.e. $H_4$). When the total magnetic field is in a direction that supports the magnetic vectors, that is, in the same direction along length 27 as the magnetization vectors, the magnetic vectors do not substantially rotate so the resistance of cell 10 does not substantially change. Correspondingly, the output voltage also does not substantially change.

However, when the total magnetic field opposes the vectors, the magnetic vectors rotate. As the field increases the vectors of layer 11 begin to rotate toward the opposite end of layer 11 (the vectors of layer 13 may rotate slightly). As the field increases further, the vectors of layer 11 continue to rotate and the resistance increases until the vectors snap to the opposite direction. For further increases, the resistance remains substantially constant until the vectors of layer 13 also snap, which produces a change in stored information. Thereafter, the resistance decreases as the field increases.

Because cell 10 operates on the premise that the value of the total magnetic field is a summation of the magnetic fields resulting from the sense, word, and digit line currents, it can be seen that stray magnetic fields combined with the total magnetic field can produce substantial errors in either of the reading or writing operations, as well as effecting cell 10 during normal storage. For example, during reading operations, when a total magnetic field is higher than the switching threshold of layer 11 but not sufficient to switch the magnetic vectors of layer 13, a stray magnetic field could easily supply a sufficient total magnetic field to surpass $H_8$ and actually switch the information in the cell. Further, because many of the memory cells are very small and packed very closely together, especially in large arrays, a relatively small amount of stray magnetic field can have a substantial effect thereon.

To alleviate the stray magnetic field problem, a passivation layer 18 is formed at least partially surrounding memory cell 10. In a preferred embodiment, layer 18 is formed of a layer of non-conductive high permeability material, such as ferrite material. Some ferrite materials that are suitable for the described purpose are at least one of: Mn—Zn-Ferrite, Ni—Zn-Ferrite, MnFeO, CuFeO, FeO, and NiFeO. Because layer 18 is non-conductive, it can be deposited directly on the surface of cell 10 or a thin layer 17 of dielectric material may be used between cell 10 and layer 18, if layer 18 is sufficiently conductive to affect the operation. Because layer 18 is formed of a high permeability material any stray magnetic fields are shielded from cell 10. Further, any magnetic field produced by current being applied to word line 16 is focused or directed onto cell 10 by layer 18 so that a smaller amount of current can be applied to word line 16 to achieve the same amount of total magnetic field required for reading and/or writing.

Thus, layer 18 performs the dual function of shielding cell 10 against stray magnetic fields and focusing internally generated magnetic fields within cell 10. In the event that only the shielding function is desired, layer 18 can be formed of a typical passivation material (any convenient dielectric material which provides a good barrier to external moisture, etc.) with a quantity of high permeability material intermixed. Generally the high permeability material can be powdered and mixed with the passivation material in a liquid or semi-liquid form and then applied to the cell or array or molded around the cell. Also, the high permeability material can be sputtered or spun-on along with the passivation material. In yet another application technique, powders of the ferrite materials can be spray coated onto the passivation layer, or on the back of the substrate, or onto the package as a very low cost deposition method.

Figure 3:
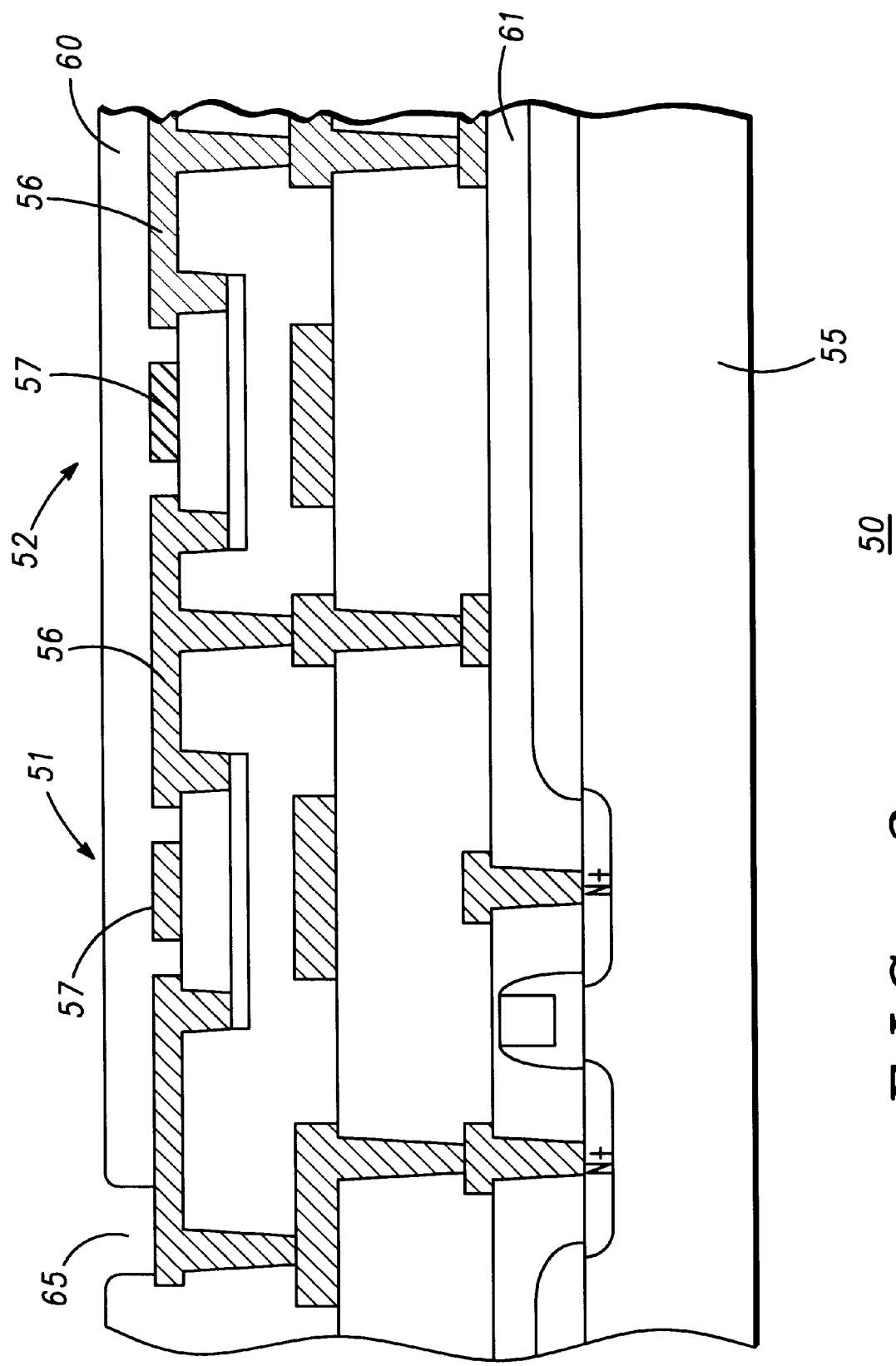
FIG. 3 is a simplified cross-sectional view of a high density non-volatile magneto-resistive memory in accordance with the present invention.

Turning now to FIG. 3, a simplified and enlarged cross-sectional view of an array 50 of cells, similar to cell 10, is illustrated. Only a portion of array 50 is illustrated for convenience, including cells 51 and 52. Typically, a plurality of cells (e.g. 51 and 52) similar to cell 10 are formed on a common substrate 55 with a space between each individual cell 51, 52, etc. A conductor 56 is then applied to interconnect cells 51, 52, etc. in individual rows (sense lines). A plurality of transverse conductors or word lines 57 are associated in overlying relationship one each with each column of the memory cells.

A passivation layer 60 is formed over the entire array to completely passivate the entire array and any integrated circuits (illustrated in block form at 61) associated with the array. Passivation layer 60, in a preferred embodiment is formed of a layer of ferrite materials which are sputtered or spun-on using any of the well known techniques. Once the entire passivation layer 60 is formed, openings 65 are formed through passivation layer 60 to allow connections to bonding pads and the like. In this preferred embodiment, passivation layer 60 not only passivates and shields the array but focuses or directs internally generated magnetic fields (e.g. those generated by current in word lines 57) onto the associated cells. As previously described, if only the functions of shielding and passivation are desired, passivation layer 60 is formed of a passivating material with powdered or small particles of a high magnetic permeability material intermixed therein.

Thus, a new and improved non-volatile magneto-resistive memory with stray magnetic shielding has been disclosed. The stray magnetic shielding does not add substantially to the cost of the memory because it is simple and easy to apply, generally being incorporated into a procedure which is already in place as, for example, the standard passivation technique. In a preferred embodiment, the stray magnetic shielding for the new and improved non-volatile magneto-resistive memory also focuses the internally generated magnetic fields of the memory. The focusing of the magnetic fields, along with elimination of stray magnetic fields allows the internally generated magnetic fields to be substantially reduced, which reduces the amount of power required to operate the memory. Further, the focusing reduces the power consumption of the cell, reduces the metal current density and improves the associated metal reliability. The focusing also reduces the size of drive transistors to increase cell real estate efficiency.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A non-volatile magneto-resistive memory with stray magnetic shielding comprising:
    a non-volatile magneto-resistive memory positioned on a substrate and defining an upper surface; and
    a passivation layer at least partially surrounding the non-volatile magneto-resistive memory, the passivation layer including ferrite materials for shielding the non-volatile magneto-resistive memory from stray magnetic fields.

2. A non-volatile magneto-resistive memory with stray magnetic shielding as claimed in claim 1 wherein the ferrite materials include one of Mn—Zn-Ferrite, Ni—Zn-Ferrite, MnFeO, CuFeO, FeO, and NiFeO.

3. A non-volatile magneto-resistive memory with stray magnetic shielding as claimed in claim 1 wherein the ferrite materials are in the form of a powder intermixed with an encapsulation material.

4. A non-volatile magneto-resistive memory with stray magnetic shielding as claimed in claim 1 wherein the ferrite materials are in the form of a layer of the ferrite material positioned adjacent the non-volatile magneto-resistive memory.

5. A non-volatile magneto-resistive memory with stray magnetic shielding comprising:
    a non-volatile magneto-resistive memory positioned on a substrate and defining an upper surface, the non-volatile magneto-resistive memory including at least first and second layers of magneto-resistive material separated by a layer of non-magnetic material;
    a layer of high permeability, non-conductive magnetic material positioned adjacent the upper surface of the non-volatile magneto-resistive memory so as to focus internally generated magnetic fields on at least one of the first and second layers of magneto-resistive material and shield the non-volatile magneto-resistive memory from stray magnetic fields; and
    a passivation layer at least partially surrounding the layer of high permeability, non-conductive magnetic material and the non-volatile magneto-resistive memory.

6. A non-volatile magneto-resistive memory with stray magnetic shielding as claimed in claim 5 wherein the layer of high permeability, non-conductive magnetic material includes ferrite materials.

7. A non-volatile magneto-resistive memory with stray magnetic shielding as claimed in claim 6 wherein the ferrite materials include one of Mn—Zn-Ferrite, Ni—Zn-Ferrite, MnFeO, CuFeO, FeO, and NiFeO.

8. A non-volatile magneto-resistive memory with stray magnetic shielding as claimed in claim 5 wherein the passivation layer includes ferrite materials.

9. A non-volatile magneto-resistive memory with stray magnetic shielding comprising:
a non-volatile magneto-resistive memory positioned on a semiconductor substrate, the non-volatile magneto-resistive memory including an array of individual cells with each cell including at least first and second layers of magneto-resistive material separated by a layer of non-magnetic material, the non-volatile magneto-resistive memory further including integrated circuitry addressing and controlling the individual cells with input/output terminals; and
a layer of high permeability, non-conductive magnetic material coating at least an upper surface of the non-volatile magneto-resistive memory so as to focus internally generated magnetic fields on at least one of the first and second layers of magneto-resistive material in each of the individual cells and shield the non-volatile magneto-resistive memory from stray magnetic fields.

10. A non-volatile magneto-resistive memory with stray magnetic shielding as claimed in claim 9 wherein the layer of high permeability, non-conductive magnetic material includes ferrite materials.

11. A non-volatile magneto-resistive memory with stray magnetic shielding as claimed in claim 10 wherein the ferrite materials include one of Mn—Zn-Ferrite, Ni—Zn-Ferrite, MnFeO, CuFeO, FeO, and NiFeO.

12. A non-volatile magneto-resistive memory with stray magnetic shielding as claimed in claim 9 including in addition a passivation layer at least partially surrounding the layer of high permeability, non-conductive magnetic material and the non-volatile magneto-resistive memory.

13. A non-volatile magneto-resistive memory with stray magnetic shielding as claimed in claim 12 wherein the passivation layer includes ferrite materials.

14. A non-volatile magneto-resistive memory with stray magnetic shielding as claimed in claim 13 wherein the ferrite materials include one of Mn—Zn-Ferrite, Ni—Zn-Ferrite, MnFeO, CuFeO, FeO, and NiFeO.

15. A non-volatile magneto-resistive memory with stray magnetic shielding as claimed in claim 13 wherein the layer of high permeability, non-conductive magnetic material includes openings therethrough for access to the input/output terminals.

* * * * *